(12) United States Patent
Fillion et al.

(10) Patent No.: US 8,498,131 B2
(45) Date of Patent: Jul. 30, 2013

(54) INTERCONNECT STRUCTURE

(75) Inventors: Raymond Albert Fillion, Niskayuna, NY (US); Kevin Matthew Durocher, Waterford, NY (US); Richard Joseph Saia, Niskayuna, NY (US); Charles Gerard Woychik, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 125 days.

(21) Appl. No.: 13/136,736

(22) Filed: Aug. 9, 2011

(65) Prior Publication Data

US 2011/0299821 A1    Dec. 8, 2011

Related U.S. Application Data

(62) Division of application No. 11/828,550, filed on Jul. 26, 2007.

(51) Int. Cl.
*H05K 7/00* (2006.01)

(52) U.S. Cl.
USPC ........... 361/783; 361/760; 361/729; 361/748; 257/680

(58) Field of Classification Search
USPC .................. 361/783, 760, 729, 748; 257/680
See application file for complete search history.

(56) References Cited

U.S. PATENT DOCUMENTS

| | | | |
|---|---|---|---|
| 4,783,695 A | 11/1988 | Eichelberger et al. | |
| 4,894,115 A | 1/1990 | Eichelberger et al. | |
| 4,933,042 A | 6/1990 | Eichelberger et al. | |
| 4,981,811 A | 1/1991 | Feygenson et al. | |
| 5,169,678 A | 12/1992 | Cole et al. | |
| 5,169,911 A | 12/1992 | Lupinski et al. | |
| 5,353,195 A | 10/1994 | Fillion et al. | |
| 5,353,498 A | 10/1994 | Fillion et al. | |
| 5,452,182 A | 9/1995 | Eichelberger et al. | |
| 5,497,033 A | 3/1996 | Fillion et al. | |
| 5,527,741 A | 6/1996 | Cole et al. | |
| 5,866,952 A | 2/1999 | Wojnarowski et al. | |
| 5,888,837 A | 3/1999 | Fillion et al. | |
| 5,946,546 A | 8/1999 | Fillion et al. | |
| 5,994,771 A * | 11/1999 | Sasaki et al. ............... | 257/700 |
| 6,239,482 B1 | 5/2001 | Fillion et al. | |
| 6,239,980 B1 | 5/2001 | Fillion et al. | |
| 6,242,279 B1 | 6/2001 | Ho et al. | |
| 6,242,282 B1 | 6/2001 | Fillion et al. | |

(Continued)

*Primary Examiner* — Timothy Thompson
*Assistant Examiner* — Andargie M Aychillhum
(74) *Attorney, Agent, or Firm* — Jean K Testa

(57) ABSTRACT

An interconnect structure includes an insulative web having a first surface and a second surface; a logic device secured to the second surface of the insulative web; a frame panel assembly including a frame base having a first surface and a second surface, a first frame insulative layer disposed between the frame base first surface and the insulative web second surface, an aperture extending through the frame base and first frame insulative layer, wherein at least a portion of the logic device is disposed within the aperture, and a first frame connector disposed between a first electrically conductive layer located on the frame base first surface, and a second electrically conductive layer located on a surface of the first frame insulative layer; a device connector disposed between an I/O contact on a surface of the logic device and a third electrical conductor located on a surface of the insulative web; and an insulative layer connector that is disposed between the third electrical conductor located on a surface of the insulative web and the second electrically conductive layer located on a surface of the first frame insulative layer.

10 Claims, 9 Drawing Sheets

U.S. PATENT DOCUMENTS

| | | |
|---|---|---|
| 6,396,153 B2 | 5/2002 | Fillion et al. |
| 6,475,877 B1 | 11/2002 | Saia et al. |
| 6,586,276 B2 | 7/2003 | Towle et al. |
| 6,603,182 B1 | 8/2003 | Low et al. |
| 6,933,493 B2 | 8/2005 | Hsin |
| 6,994,897 B2 | 2/2006 | Durocher et al. |
| 7,078,788 B2 | 7/2006 | Vu et al. |
| 7,262,497 B2 | 8/2007 | Fang |
| 7,287,318 B2 | 10/2007 | Bhullar et al. |
| 7,327,005 B2 | 2/2008 | Brechignac et al. |
| 7,545,047 B2 | 6/2009 | Bauer et al. |
| 2006/0186531 A1 | 8/2006 | Hsu |
| 2006/0198570 A1 | 9/2006 | Ogawa et al. |
| 2006/0258048 A1 | 11/2006 | Vrtis |
| 2008/0150164 A1* | 6/2008 | Chia .......................... 257/783 |

* cited by examiner

INTERCONNECT STRUCTURE

This application is a Division of U.S. patent application Ser. No. 11/828,550 entitled "Interconnect Structure" filed Jul. 26, 2007, which is incorporated herein by reference.

TECHNICAL FIELD

The invention includes embodiments that relate to an interconnect structure. The interconnect structure may be electrical or optical.

DISCUSSION OF ART

In a current embedded chip process, referred to as Embedded Chip Build-Up (ECBU) or Chips First Build-Up (CFBU) technology, bare chips are packaged with perimeter or peripheral I/O pads or with an array of I/O pads distributed over the top surface into a high-density interconnect structure without the need for either solder joints or wirebonds. The ECBU or CFBU process may form a chip carrier that interconnects a complex semiconductor chip to larger contact pads that are compatible with board level assemblies such as printed circuit boards.

Semiconductor devices are being produced with increasing I/O counts (4000 to 8000 or more). As the CFBU technology is applied to these increasingly complex semiconductor devices, the correspondingly increased routing requirements of the chips forces the use of additional routing layers and/or thinner conductor lines and spaces between the lines. Both adding more routing layers with the same feature size and going to smaller features to route out more lines may increase yield loss. Because the CFBU technology does not form interconnect layers, or the lines, spaces and layer-to-layer vias associated with those interconnect layers, until after the chip is committed to the carrier, any increase in yield loss increases the number of costly chips put at risk of being scrapped. Additionally, decoupling capacitors need to be proximate to a fast switching processor to be suitably effective. In CFBU carriers having thin profiles, e.g. less than 1 millimeter (mm), versus the industry standard Flip Chip Build-Up carriers having a profile of 2 mm or more, there may be insufficient room to mount necessary discrete decoupling capacitors within the carrier. And, pin grid array pins have less mechanical strength than ball grid array solder balls.

BRIEF DESCRIPTION

In one embodiment, the invention provides an electronic component that includes a frame capable of supporting a web and a logic device secured to the web. The frame supports optical or electronic circuitry, and the supported optical or electronic circuitry communicates with the logic device.

In one aspect, the electronic circuitry includes passive electronic components, such as capacitors, inductors, or resistors. In another aspect, the optical circuitry includes beam splitters, mirrors, grates, and the like. The frame can be combined with other elements to form an electronic package.

In one embodiment, the invention provides an interconnect structure including an insulative web having a first surface and a second surface; a logic device secured to the second surface of the insulative web; a frame panel assembly including a frame base having a first surface and a second surface, a first frame insulative layer disposed between the frame base first surface and the insulative web second surface, an aperture extending through the frame base and first frame insulative layer, wherein at least a portion of the logic device is disposed within the aperture, and a first frame connector disposed between a first electrically conductive layer located on the frame base first surface, and a second electrically conductive layer located on a surface of the first frame insulative layer; a device connector disposed between an I/O contact on a surface of the logic device and a third electrical conductor located on a surface of the insulative web; and an insulative layer connector that is disposed between the third electrical conductor located on a surface of the insulative web and the second electrically conductive layer located on a surface of the first frame insulative layer.

In another embodiment, the invention provides an article including an insulative web having a first surface and a second surface; a logic device secured to the second surface of the insulative web; a frame panel assembly including a frame base having a first surface and a second surface, a first frame insulative layer disposed between the frame base first surface and the insulative web second surface, an aperture extending through the frame base and first frame insulative layer, wherein at least a portion of the logic device is disposed within the aperture, and a first frame connector disposed between the frame base and the first frame insulative layer; a device connector disposed between the logic device and the insulative web; and an insulative layer connector that is disposed between the insulative web and the first frame insulative layer.

DETAILED DESCRIPTION

The invention includes embodiments that relate to an interconnect structure. The interconnect structure can have an integrated frame assembly. The interconnect structure can be optical or electrical.

As used herein, a passive component or passive element is a component that consumes (but does not produce) electrical energy, or is a component that is incapable of power gain. A component that is not passive is called an active component. A circuit consisting entirely of passive components is also considered passive (and has the same properties as a passive component). Under this definition; passive components include capacitors, inductors, resistors, transformers, voltage sources, and current sources. Active components may include components with one or more transistors, relays, glow tubes, voltage regulator tubes, tunnel diodes, and similar devices. The term "insulative" refers to electrically insulative, and the term "conductive" refers to electrically conductive, unless context or language indicates otherwise. An "interconnection layer" is an insulative layer having at least one via and at least one circuit or connector thereon.

Figure 1:
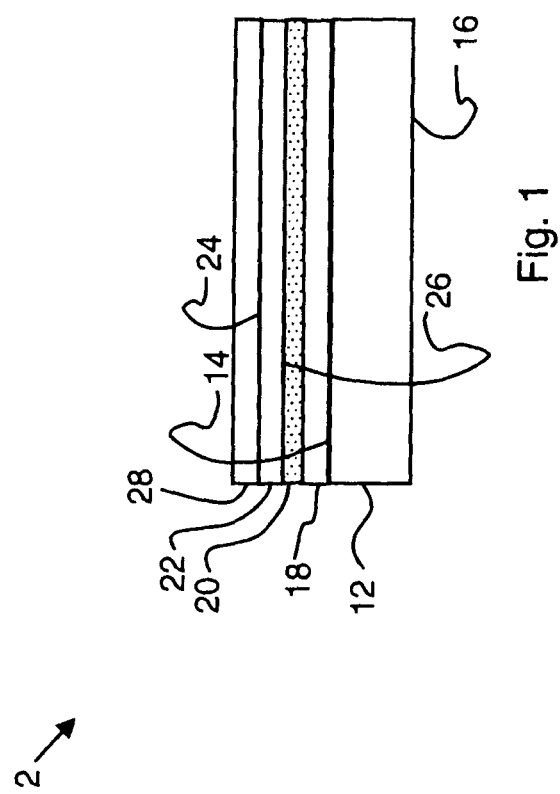
FIG. 1 is a schematic side view of an intermediate article.
Figure 2:
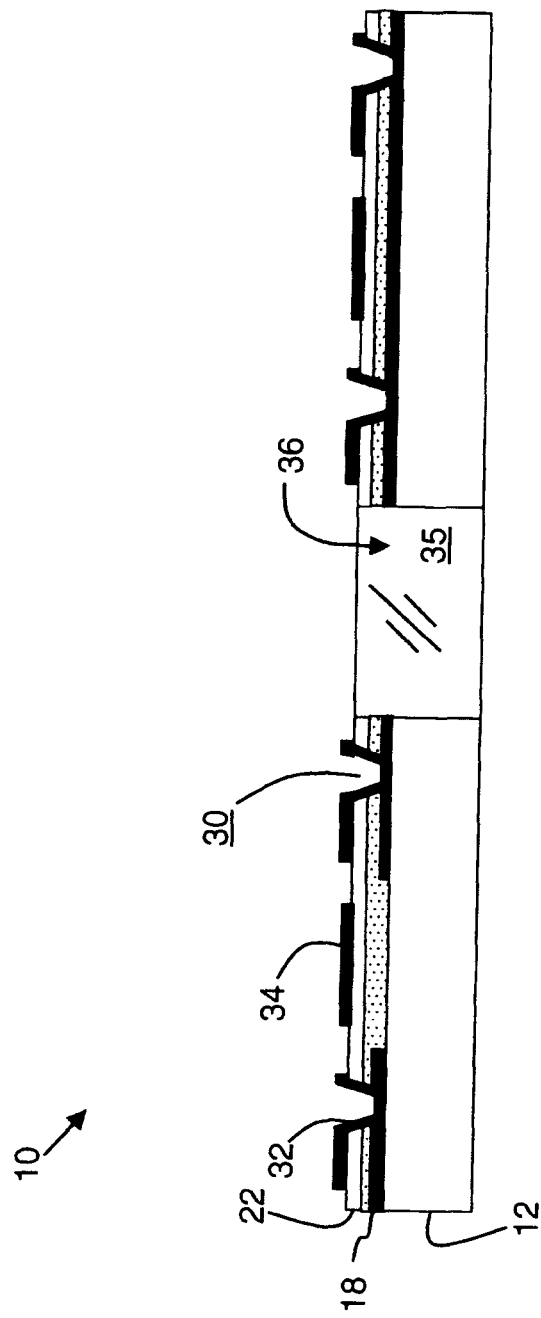
FIG. 2 is a schematic side view of a frame assembly in accordance with an embodiment of the invention that formed from the intermediate article of FIG. 1.

Referring to FIGS. 1 and 2, an interconnect intermediate structure 2 is shown. The intermediate structure 2 (FIG. 1) is modified to produce a frame 10 (FIG. 2) according to an embodiment of the invention. The frame includes a frame base 12 having a first surface 14 and a second surface 16. A first conductive layer 18 is secured to the frame base first surface. A frame adhesive layer 20 secures a first frame insulative layer 22 to the frame base, and overlays at least a portion of the first conductive layer. The frame adhesive layer is not shown in some figures for clarity. The first frame insulative layer has a first, outward-facing surface 24 and a second, inward-facing surface 26. A second electrically conductive layer 28 is located on the first surface of the first frame insulative layer.

Referring to FIG. 2, a via 30 is formed that extend through the frame adhesive layer and the first frame insulative layer. The via is filled with electrically conductive material to form a first frame connector 32. The first frame connector allows communication through the frame adhesive layer and the first frame insulative layer to the first conductive layer located on the frame base first surface. A conductive trace or contact 34 is formed on the first frame insulative layer outward-facing surface. The frame base has an inner surface 35 that defines a frame aperture 36, which extends through the frame base.

Figure 3:
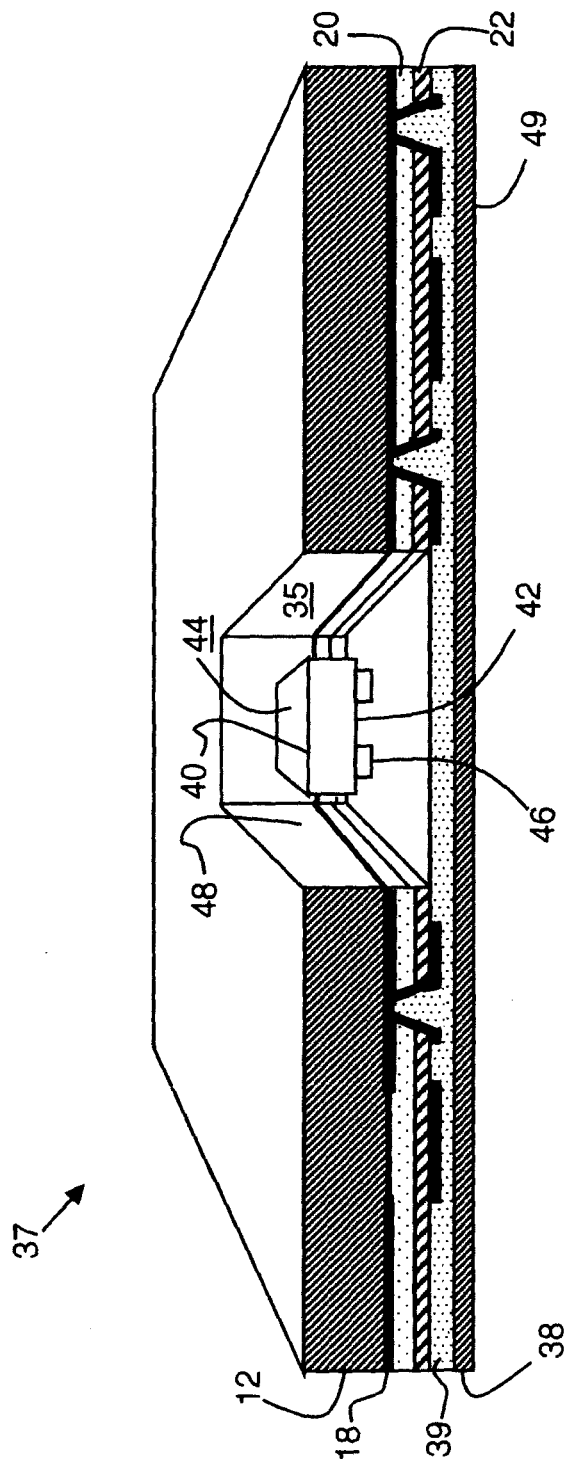
FIG. 3 is a cross-sectional perspective side view of the frame assembly of FIG. 2, and a logic device being bonded thereto, according to an embodiment of the invention.

FIG. 3 is a cross-sectional perspective view of a frame assembly 37 that includes the frame of FIG. 2 (not to scale) and an insulative web 38 secured to the frame by an insulative adhesive layer 39. The insulative web extends across and closes an otherwise open end of the frame aperture to form a nest or recess. A logic device 40 is shown being mounted to the insulative web in the frame aperture spaced from the inward facing surface of the frame base. The logic device has a first surface 42 and a second surface 44. The first surface of the logic device includes an I/O contact 46. The logic device I/O contact electrically mates to a corresponding bond pad (not shown), or the like, on an inward facing surface of the insulative web, or on an inward facing surface of the insulative web adhesive layer if such extends over an inward facing surface of the insulative web. A trench or gap 48 is defined by a surface of the logic device and the inward facing surface of the frame base. Reference number 49 indicates an outward facing surface of the insulative web.

While alternative frames can be a monolith, the illustrated frame includes the frame base, the frame insulative layer, and the frame adhesive layer that bonds them together. Metallization layers, circuitry and passives may be included on and/or embedded in any of the foregoing, depending the embodiment.

The frame base may be formed from a material selected from metal, ceramic, or a polymeric material. Suitable polymeric materials may include a polyimide, a ROMP-capable monomer, or an epoxy. The polymeric material may include reinforcing filler. Such filler may include fibers or small inorganic particles. Suitable fibers may be glass fibers or carbon fibers. Suitable particles may include silica, silicon carbide, boron nitride, aluminum oxide, or aluminum nitride. If formed from a polymeric material, the frame base may be a molded or cast structure. Suitable molding techniques may include resin injection molding, bulk molding, and the like.

The frame base includes a material selected for a particular design based on the desired coefficient of thermal expansion, rigidity, or other desired mechanical, electrical, and thermal properties. If the frame base is electrically conductive, a dielectric or electrically insulating overcoating may be applied to the surface of the frame base. Suitable electrically conductive frame material may be metal. Suitable metals for use as the frame base may be selected from aluminum, nickel, titanium, iron, copper, or tin. Alternatively, the metal may be an alloy or metal composite. Suitable alloys and composites may include, for example, stainless steel or Cu:Invar:Cu. Suitable electrically insulative overcoat material may be a ceramic material, polymeric material, or enamel. The overcoat material may be selected based on thermal coefficient of expansion matching, dielectric properties of the overcoat, adhesion, and other properties of the materials used relative to each other. The electrically insulative overcoat material may insulate the conductive traces and electronic devices supported on the frame base.

The material of the frame base and of the insulative layers should be selected to avoid warping the frame base during use. The frame base material should be selected so that the Coefficient of Thermal Expansion (CTE) should about match the CTE one or more components with which the structure will be assembled. Semiconductor carriers may secure to an organic printed circuit board. Such a printed circuit board may have a CTE in a range of from about 15 ppm/° C. to about 20 ppm/° C. If the insulative layers have a CTE higher than the circuit board CTD, then the frame base may warp to become concave. If the insulative layer CTE is lower the frame base may warp to become convex. Selecting a frame base to have a relatively increased Young's Modulus may reduce the chance of warping, although the stress and strain on the frame base may be relatively high. In addition, selecting the insulative layers to lower their Young's Modulus and/or shrinkage of the insulative layers during curing, may reduce the chance of warping and the stress or strain on the frame base.

The frame base, and thus the frame, has an inward facing surface that defines the opening or aperture. Milling, mechanical stamping, laser cutting, water jetting, wet etching, laser ablation, die punching, or dry etching may form the aperture in the frame base. The logic device can be supported on an insulative web within the aperture (further details are provided hereinbelow). The aperture may be formed before or after the addition of the frame insulative layer, the frame adhesive layer, the first conductive layer, and other components.

The first electrically conductive layer may be a metallization plane disposed over at least a portion of the frame base first surface, and optionally on at least selected portions of the frame base second surface. The first electrically conductive layer is a continuous metal plane that can function as a reference plane. The reference plane may be a ground plane or a power plane. Alternatively, the first electrically conductive layer may be a segmented metal plane. Metallization on the first surface of the frame insulative layer may be used as a signal routing layer, while metallization on the first surface of the frame base may be used as a ground reference plane. Metallization on the first surface of the insulative web may be used either as a second signal routing layer or as a second reference plane such as one used for a voltage plane. Both the ground reference on the frame insulative layer and the reference voltage plane on the insulative web can be used as one solid voltage plane or as a plane with multiple, isolated reference planes as may be required for high performance logic devices. Many other configurations of signal layers, voltage reference layer and layers containing both signal routing and reference planes can be constructed as required by specific circuit requirements.

Suitable materials for use forming the conductive layer may include one or more of Al, Ag, Au, Cu, Ni, Pb, Sn, and Ti. The conductive layer may be applied to the surfaces of the frame base, the frame insulative layer, and/or the insulative web by electroplating, sputtering, or electroless plating. In one embodiment, the conductive layer may be elemental metal formed by the decomposition of organic metal precursors. The frame base may have a tie layer to improve adhesion with the conductive layer. Suitable materials for use as a tie layer may include polyimide, epoxy, and silicone.

The frame adhesive layer may be applied to the second surface of the first frame insulative layer, to the surface of the frame base, or as a sandwich laminate. The application method may include spin coating, spray coating, roller coating, meniscus coating, pattern print depositing, jetting, or by another dispensing method. The frame insulative layer is positioned over and contacted to the frame base first surface after the frame adhesive is applied to the first frame insulative layer. The frame adhesive layer may be fully cured to bond the first frame insulative layer to the frame base first surface. A suitable material for use in the adhesive layer may include a thermoset adhesive or a radiation-cured adhesive. Other suitable adhesives may include a thermoplastic adhesive, water cure adhesive, air cure adhesives. The adhesive layer may be cured thermally or by a combination of heat and radiation. If thermally curable, a suitable cure temperature may be in the about 100 degree Celsius to about 200 degree Celsius range. If radiation curable, suitable radiation may include ultraviolet (UV) light, electron beam, and/or microwave radiation.

A partial vacuum may be used to remove volatiles from the adhesive during cure, if any are present. Examples of suitable adhesives may include a thermoset polymers and radiation curable polymers, each in combination with appropriate curing agents, hardeners, additives, and the like. Suitable thermoset polymers may include an epoxy, silicone, acrylate, urethane, polyetherimide, or polyimide, or a blend of two or more thereof. Suitable commercially available polyimides may include CIBA GEIGY 412 (manufactured by Ciba Geigy), AMOCO AI-10 (manufactured by Amoco Chemicals Corporation) and PYRE-MI (manufactured by E. I. du Pont de Nemours & Co.). The CIBA GEIGY 412 has a $T_g$ of about 360 degrees Celsius.

Suitable methods for applying an adhesive layer to an insulative layer (or web) include spray coating, spin coating, roll coating, meniscus coating, dip coating, transfer coating, jetting, drop dispensing, pattern print depositing, stenciling, and dry film laminating. The adhesive layer may have a thickness of greater than about 5 micrometers. In one embodiment, the adhesive layer may have a thickness in a range of from about 5 micrometers to about 10 micrometers, from about 10 micrometers to about 20 micrometers, from about 20 micrometers to about 30 micrometers, from about 30 micrometers to about 40 micrometers, from about 40 micrometers to about 50 micrometers, or greater than about 50 micrometers. In an alternative embodiment, the adhesive layer may be a prefabricated self-adhesive film that may be applied to a surface of the additional insulative layer. In another alternative embodiment, mixed adhesive materials are used—such as a pressure sensitive adhesive in a few tack spots to hold the layer in place while a thermoset adhesive cures to a b-stage.

The frame insulative layer may be an organic dielectric film or support web. As used herein, a film or web is a flexible sheet that is not self-supporting. A film has a thickness of less than 0.2 millimeters. The film may be continuous in some embodiments, and discontinuous in other embodiments. The film may be reinforced with, for example, fibrous material. Also, the film may include a plurality of sub-layers, and the sub-layers may have compositions and properties that differ from each other. For example, one sub-layer may provide dimensional stability, and another may provide electrostatic discharge, thermal conduction, or high dielectric properties. Suitable material for use as the frame insulative layer may include one or more of polyimide, polyetherimide, benzocyclobutene (BCB), liquid crystal polymer, bismaleimide-triazine resin (BT resin), epoxy, or silicone. Suitable commercially available materials for use in the frame insulative layer may include KAPTON H polyimide or KAPTON E polyimide (manufactured by E. I. du Pont de Nemours & Co.), APICAL AV polyimide (manufactured by Kanegafugi Chemical Industry Company), UPILEX polyimide (manufactured by UBE Industries, Ltd.), and ULTEM polyetherimide (manufactured by General Electric Company). In the illustrated embodiment, the frame insulative layer is fully cured as KAPTON H polyimide.

In other embodiments, the laminated frame insulative structure described above, including the frame insulative layer and the frame adhesive, can be substituted with a single dielectric deposition such as a thermoset or thermoplastic polymer coating or a self-bonding frame insulative layer. The thermoplastic polymer could be a polyetherimide resin such as ULTEM 1000 or ULTEM 6000 available from GE Plastics, a polyether ether ketone such as PEEK available from Victrex, a polyether sulfone such as VITREX available from ICI Americas, a polyether sulfone such as XU 218 available from Ciba Giegy, or UDEL 1700 polysulfone available from Union Carbide. The thermoplastic or thermoset polymer may be applied by spray coating, spin coating, roll coating, or by dry film laminating.

Suitable conductors include optical and electrical conductors, and may be located on the frame insulative layer. Suitable electrical conductors may include pads, pins, bumps, and solder balls. The connector between the frame base and the first frame insulative layer may be a structure selected based on application specific parameters. For example, apertures, holes, or vias extend from the first surface of the first frame insulative layer, through the frame adhesive layer, to the first electrically conductive layer disposed on the frame base first surface. The vias expose areas of metal on the frame base first surface. In one embodiment, the vias may be sized so that they are micro-vias. Laser ablating, wet chemical etching, plasma etching, reactive ion etching, or photolithography may form the vias. Other suitable via formation may be had, in whole or in part, by using mechanical drilling or punching.

The electrically conductive material filled into the vias may be metal, an inherently electrically conductive polymer, a polymer or ceramic filled with electrically conductive filler, or a metal. If the electrically conductive material is a, suitable metal may include one or more of Ag, Au, Al, Cu, Ni, Sn, and Ti. If the electrically conductive material is an inherently electrically conductive polymer, may be used in an unfilled state to, for example, achieve a determined viscosity and/or have a determined wetting ability or deaerating ability. The inherently electrically conductive polymer may be deposited by jetting or by screening.

Suitable electrically conductive filled materials may include an epoxy, polysulfone, or polyurethane that is filled with, for example, conductive metal particles. Such metal particles may include silver and gold. Other suitable metal particles may include one or more of Al, Cu, Ni, Sn, and Ti. Rather than filled polymeric material, inherently conductive polymers may be used. Suitable conductive polymers include polyacetylene, polypyrrole, polythiophene, polyaniline, polyfluorene, poly 3-hexylthiophene, polynaphthalene, poly p-phenylene sulfide, and poly para-phenylene vinylene. Naturally, the inherently conductive polymer may be filled with an electrically conductive filler to further enhance the electrical conductivity.

If the conductive material is metal, the conductive material may be deposited by methods including one or more of sputtering, evaporating, electroplating, or electroless plating. Suitable metals may include one or more of Al, Ag, Au, Cu, Ni, Pb, Sn and Ti. In one embodiment, both the first surface of the first frame insulative layer and the exposed surface of the vias extending to the electrical conductor on the frame base are metallized. The metallization may use a combined sputter plate and electroplate sequence. The frame insulative layer may be placed in a vacuum sputter system with the first surface of the frame insulative layer and the vias exposed to the sputter system. A backsputter step sputter-etches the exposed electrical conductor on the frame base to remove residual adhesive material and native metal oxide. Further, a backsputter step etches into the frame insulative layer surface. The sputter etch of the metal electrical conductor located on the frame base first surface reduces contact resistance of the subsequent metallization steps while the etching of the frame insulative layer may increase the metal adhesion to the first surface of the frame insulative layer.

Metal deposited on the frame insulative layer first surface can be patterned by using subtractive or by using semi-additive techniques to form metallized vias, pads and signal routing traces. In one semi-additive patterning process, a seed layer having a thickness of about 0.1 micrometers to about 2.0 micrometers may be applied to the entire frame insulative first surface using a metallization process such as those mentioned above. Areas on the first surface of the frame insulative layer that are desired to retain metal such as interconnect traces, I/O contacts, and vias are left uncovered with the photoresist (not shown), while areas of the frame insulative layer surface that are desired to have the metal removed are left covered. The exposed metallized areas of the first surface of the frame insulative layer, including the via sidewalls, are then electroplated to a thickness that is in a range of from about 1 micrometers to about 20 micrometers. Following the completion of the plate-up process step, the remaining photoresist material may be removed. The removal reveals the metallized regions on the first surface of the frame insulative layer where the seed metal was not plated-up. Multiple standard wet metal etch baths may remove the exposed seed metal to leave the desired metallization pattern.

In a subtractive metal patterning process, the metallized surfaces of the frame insulative layer, including the via sidewalls, are electroplated with metal to form a layer with a thickness in a range of from about 2 micrometers to about 20 micrometers. A photomask material (not shown) may be disposed over the first surface of the frame insulative layer and photo-patterned to expose selected regions of the surface. Areas on the first surface of the frame insulative layer that are desired to retain metal such as interconnect traces, I/O contacts and vias are left covered with the photoresist, and areas of the frame insulative surface that are intended to have the metal removed are exposed and not covered. Multiple wet metal etch baths remove plated up and sputtered metal in the exposed frame insulative layer surface regions, while the remaining areas are protected from the wet etchants by the masking material. Following completion of the etching step, the remaining photoresist material may be removed. Removing the photoresist material reveals the desired metallization pattern.

The insulative web secures to the frame insulative layer by the insulative web adhesive layer. The insulative web adhesive layer may have a thickness that is greater than about 5 micrometers. In one embodiment, the adhesive layer may have a thickness in a range of from about 5 micrometers to about 10 micrometers, from about 10 micrometers to about 20 micrometers, from about 20 micrometers to about 30 micrometers, from about 30 micrometers to about 40 micrometers, from about 40 micrometers to about 50 micrometers, or greater than about 50 micrometers.

The insulative web adhesive layer may be applied to the second surface of the insulative web by spin coating, spray coating, roller coating, meniscus coating, pattern print depositing, or jetting. In one embodiment, the adhesive may be applied by dry film lamination. Suitable adhesives include those described hereinabove.

Figure 4:
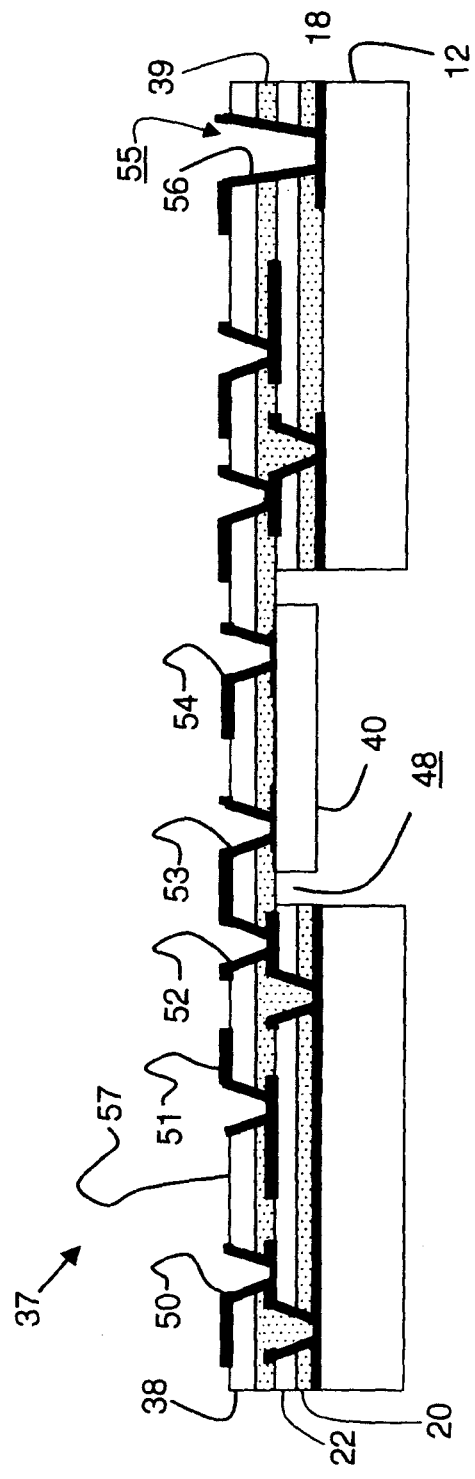
FIG. 4 is a schematic side view of an interconnect structure in accordance with an embodiment of the invention.

IO contacts on the logic device communicate with corresponding contacts on the insulative web (see FIG. 4). Examples of I/O contacts that may be located on the logic device include pads, pins, solder bumps, and solder balls. In the illustrated embodiment, the I/O contacts are I/O pads. Other suitable logic devices may be a packaged or unpackaged semiconductor chip such as a microprocessor, a microcontroller, a video processor, or an ASIC (Application Specific Integrated Circuit); a discrete passive; or a BGA carrier. In one embodiment, the electronic device may be a semiconductor silicon chip with an array of I/O contact pads disposed on its first surface.

The frame panel assembly can be prepared with a plurality of apertures. If the apertures are formed in the frame base prior to the application of the frame insulative layer, the areas of the frame insulative layer overlaying the apertures in the frame base may be removed. Removal may be by laser ablation, water jetting, or by mechanical means.

Referring to FIG. 4, the insulative web (and insulative web adhesive layer, as needed) is processed to provide apertures or vias therethrough. Vias are formed in the apertures to provide circuitry and electrical contacts. Particularly, one contact 50 communicates with a contact through the frame insulative layer to the first frame conductive layer, another contact 51 communicates to the metallization or circuitry on the frame first insulative layer, another contact 52 communicates with both the first frame conductive layer, and with another contact 53 that communicates with an I/O contact on the logic device. Yet another contact 54 communicates directly with an I/O contact on the circuit device, but not with the first frame conductive layer. And, one via 55 extends though both the insulative web and the first frame insulative layer (and corresponding adhesive layers), and a contact 56 communicates directly with the first frame conductive layer. Other permutations, circuits and builds are contemplated and are possible, but are not shown. An outward facing surface 57 of the insulative web has contacts and circuitry exposed thereon.

The first surface of the logic device contacts the adhesive coated second surface of the insulative web. Alternatively, the insulative web is contacted directly if no adhesive is present. At least a portion of the logic device may be disposed within the frame aperture in the frame panel assembly. The adhesive bonds the insulative web to the frame, and bonds the logic device to the insulative web.

Some contacts are disposed on the first surface of the logic device and may be referred to as a device connector. The device connector may communicate through conductive material in one or more vias that each extends from the first surface of the insulative web to an I/O contact disposed on the first surface of the logic device. Similarly, a frame insulative layer connector may be secured to the frame insulative layer, a frame base connector may be secured to the frame base, and an insulative web connector may be secured to an insulative web. Conductive material may be disposed within a via to bridge or route through the supporting layer, as needed.

Other connectors in the interconnect structure and assembly may be formed in a manner similar to the formation process of the first frame connector and insulative layer connector. In one embodiment, the first surface of the insulative web may be metallized using the metallization and patterning steps described above for the frame insulative layer.

The preceding process steps complete a first interconnect layer and its connections to I/O contacts of the logic device and to the conductive layers as needed. While only a single logic device having only two I/O contacts is shown for clarity, interconnection of more complex logic devices is included. Logic devices may include microprocessors, video processors and ASICs (Application Specific Integrated Circuits). Some logic devices may require an additional interconnection layer to fully route out all of the required chip I/O contacts. For these electronic devices, one or more additional interconnect layers may be formed over the frame and/or the insulative web. For more simple logic devices with less routing complexity, only one interconnect layer may be required.

Figure 5:
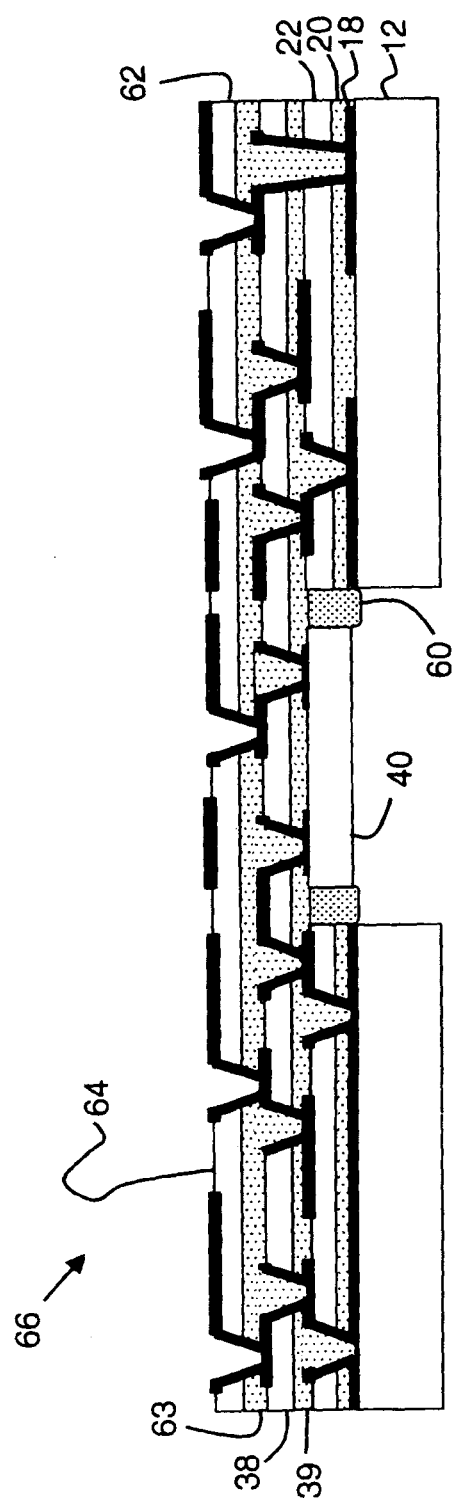
FIG. 5 is a schematic side view of an interconnect structure prepared from the interconnect structure of FIG. 4 in accordance with an embodiment of the invention.

Referring to FIG. 5, the inner surface of the frame aperture and the outer edge of the logic device disposed within the frame aperture define the gap or moat. This gap either may be left unfilled or may be filled with encapsulation material. Encapsulation material 60 surrounds the logic device in the gap. The gap between the inner edges of the frame panel aperture and the outer edge of the logic device may be filled with encapsulation material. In other embodiments, the game may be partially filled. The height of the fill may be in a range of from about 1 percent to about 50 percent, from about 50 percent to about 100 percent, or may flow over the logic device, based on the height of the logic device relative to the insulative web surface. By another measure, the gap volume may be in a range of from about 10 percent full to about 30 percent full, from about 30 percent full to about 50 percent full, from about 50 percent full to about 80 percent full, or from about 80 percent full to about 95 percent full.

Suitable encapsulation materials may include thermoplastics and/or thermoset polymers. Suitable aliphatic and aromatic polymers may include polyamides, polyacrylates, polyurethanes, polypropylene, polysulfone, polytetrafluoroethylenes, epoxies, benzocyclobutene (BCB), polyimides, polyetherimides, polycarbonates, silicones, or a blend of two or more thereof. Other suitable encapsulant materials may include room temperature vulcanizable material. In one embodiment, the encapsulation material may be a thermoset polymer due to the relatively low cure temperatures available. The encapsulation material may include a filler material. The type, size, and amount of the filler material may be used to tailor various molding material properties, such as thermal conductivity, thermal coefficient-of-expansion, viscosity, swim resistance, shrinkage, out gassing, and moisture uptake. For example, these materials may include particles, fibers, screens, mats, or plates of inorganic particles.

Suitable filler materials may be formed from glass, ceramic, or metal. Some examples of filler material include silica, SiC, $Al_2O_3$, BN, and AlN. Other suitable filler may include forms of carbon. In one embodiment, the filler material is thermally conductive and electrically insulative. Additives may be added to affect encapsulant properties. Some additives may increase the glass transition temperature, the flexibility, the tensile strength, the flowability, or the oxidation resistance. Other affected properties may include thermal conductivity, thermal coefficient-of-expansion, viscosity, swim resistance, shrinkage, and moisture uptake. The encapsulation material may be cured.

In certain embodiments, it may be beneficial to simultaneously cure the encapsulation material and the insulative web adhesive layer. The adhesive layer may be radiation cured. Suitable radiation may include IR (heat), UV light, e-beam, and/or microwaves.

With further reference to FIG. 5, additional interconnection layers are formed by securing a second insulative web 62 to the outward facing surface of the first interconnect layer 57 using a second insulative web adhesive layer 63. An outer surface 64 of the second insulative web supports contacts that communicate with, for example, the first conductive layer, the second conductive layer, the logic device I/O contacts, and other circuitry (not shown). The communication may be direct using vias that extend through to the appropriate conductive layer, or may be indirect by using a connector that communicates with the appropriate conductive layer. The interconnect structure 66 can be prepared with an encapsulation layer, further interconnection layers, pins, solder balls, and the like.

The second surface of the second insulative web may be placed in contact with the outward facing surface (non-component side) of the first insulative web. The adhesive layer may be cured to bond the second insulative web to the first insulative web. In one embodiment, the second insulative layer may be laminated over the first surface of the insulative web using a heated vacuum lamination system.

The device connectors may communicate through the second insulative layer to an I/O contact disposed on the outward facing surface of the second insulative web. The outward facing surface of the second insulative web may be metallized to form a corresponding conductive layer. Metallized areas can be used for I/O pads and/or a reference plane and/or additional signal routing traces. The process can be additive, or subtractive. An additional connector may be formed between at least one electrical conductor on the first surface of the second insulative layer and a conductive layer, or circuit, on the frame base or frame insulative layer. A multi-layer deep via may be formed that extends from the first surface of the second insulative web to the first surface of the frame insulative layer.

A plurality of additional interconnect layers may be formed in a similar manner. The process of insulative layer coating, via formation, metallization and photo patterning can be repeated to add additional reference planes or interconnect layers.

With regard to the final outward facing interconnect layer, a dielectric or solder masking material may be used to passivate metal traces and to define contact pads used for assembly or package I/O contacts. The package I/O contacts may have additional metal depositions applied to the exposed contact pads to provide more robust I/O contacts. Suitable additional metal depositions may include an alloy, such as Ti:Ni:Au. The additional metal depositions may be applied by electroless plating. The I/O contact pads can have pins, solder spheres, or leads attached to them, or the I/O contact pads can create a pad array.

Figure 6:
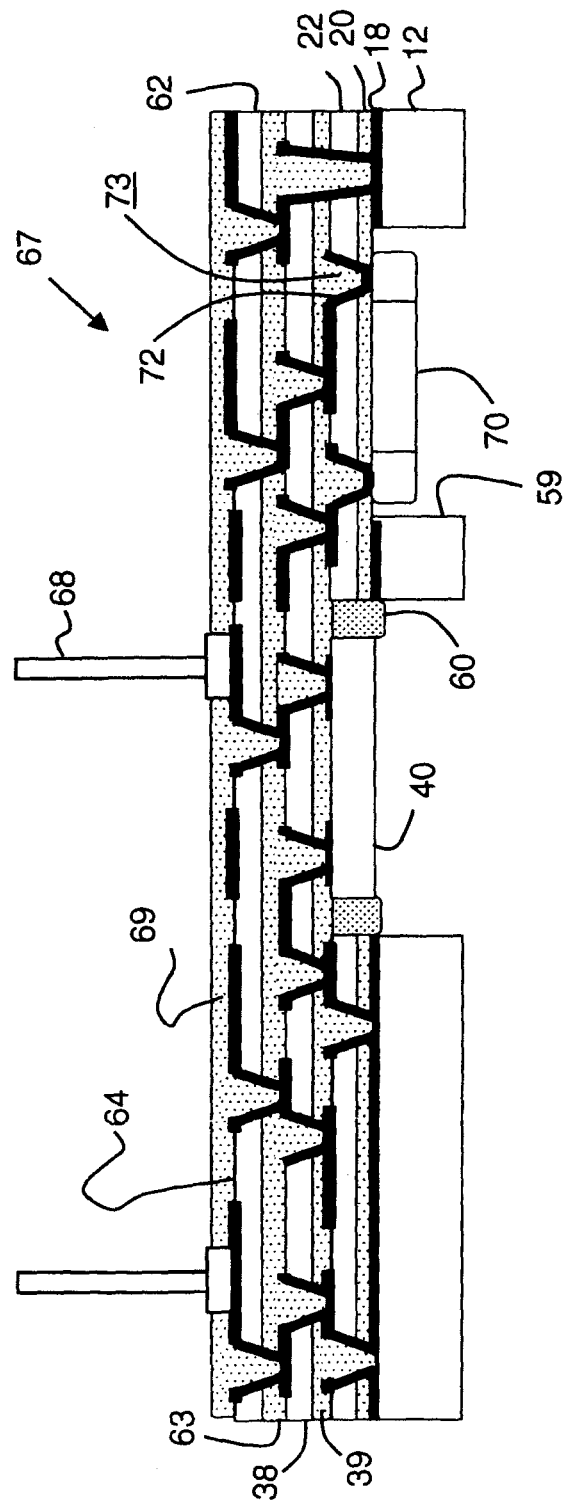
FIG. 6 is a schematic side view of an interconnect structure in accordance with an embodiment of the invention.

With reference to FIG. 6, interconnect structure 67 is similar to the interconnect structure shown in FIG. 5, further including an array of pins 68, a passivation layer 69 and a passive element 70 located in a second frame aperture defined by inner walls 59. The second aperture can be opened through the frame base when the aperture 36 is opened. One or more passive connectors 72 connect through vias 73, circuits or the first conductive layer to the passive element.

One of the pins of the illustrated array communicates with one of the logic device I/O contacts, and the other illustrated pin of the array communicates with the other logic device I/O contact. In an alternative embodiment (not shown), an array of solder balls, solder bumps, electrically conductive polymer bumps, contact pads, leads, or optical I/O connects are used in place of the pins.

The passive connector allows communication from an I/O contact on the passive device to a conductor located on the insulative web. The passive connector may include one or more vias that each extend from the first surface of the insulative web to an I/O contact disposed on the surface of the passive device. Electrically conductive material may be disposed within at least a portion of the via, and the electrically conducting material extends through the via to the I/O contact located on the passive device.

Figure 7:
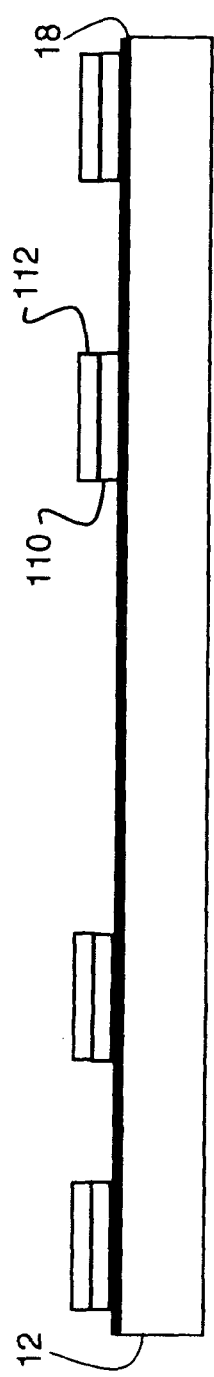
FIG. 7 is schematic side view of frame assembly having a metallized layer and an insulative layer in accordance with an embodiment of the invention.

FIG. 7 is a schematic diagram that illustrates a structure 100 in which a thin frame insulative layer 110 and an electrically conductive layer 112 are deposited on the first conductive layer 18 located on the frame base surface. Portions of the frame insulative layer and the conductive layer are removed to form a distributed passive element. An example of a distributed passive element is a decoupling capacitor.

The thin frame insulative layer may be formed from an organic dielectric material. A suitable organic dielectric material may include a polyimide or diamond like carbon. The layer may be deposited by spin coating (polyimide) or deposited by evaporation (DLC). In an alternative embodiment, the thin frame insulative layer may be formed from an inorganic dielectric material. Suitable inorganic dielectric material may include $SrTiO_3$, PZT, BST, TaO2, or $BaTiO_3$. The layer may be formed by chemical solution deposition, by metal oxide deposition, or formed by hydrothermal synthesis.

The conductive layer may be patterned to expose selected areas of the thin, electrically resistive dielectric layer on the frame insulative layer. Alternatively, the electrically conductive layer, the thin resistive dielectric layer and thin frame insulative layer may be separately patterned to expose selected areas of the thin resistive dielectric layer, the thin frame insulative layer and the first frame electrical conductor creating patterned passive elements. Examples of patterned passive elements may include resistors, capacitors, inductors, and conductor elements.

Figure 8:
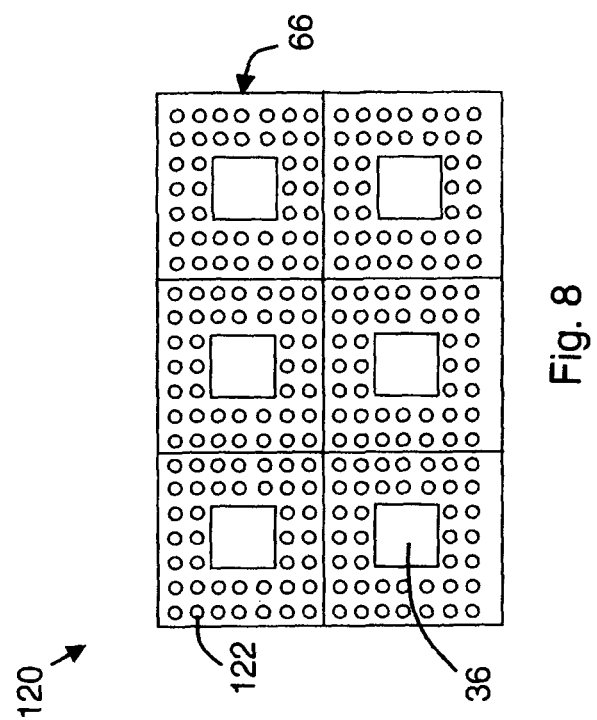
FIG. 8 is a schematic top view of a plurality of frame assemblies in accordance with an embodiment of the invention.
Figure 9:
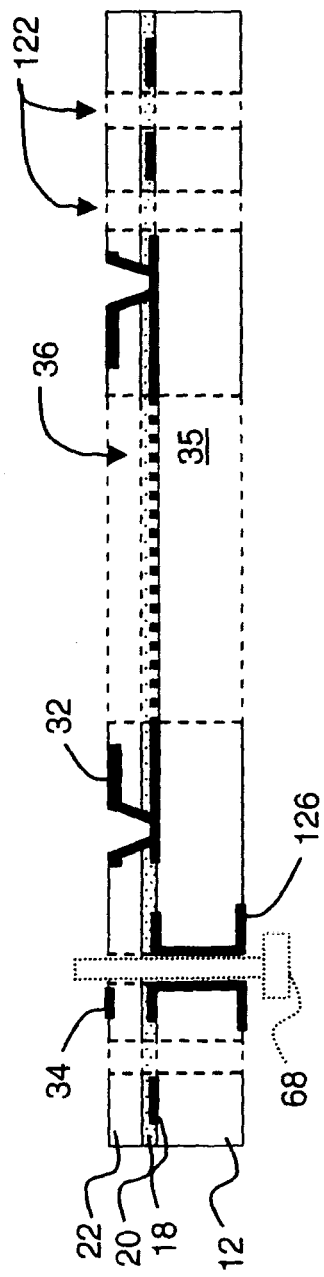
FIG. 9 is a schematic side view of an interconnect structure in accordance with an embodiment of the invention.

With reference to FIGS. 8-9, a frame panel assembly 120 may include multiple interconnect structures 66, each having a plurality of through-holes 122 sized and shaped to receive array pins during fabrication. The frame surface may be patterned to form regions without conductive material through which the through-hole may be formed (FIG. 9). A suitable through-hole formation process may include mechanical drilling, punching, laser ablating, or water jetting.

After the through-holes are formed in the frame base (in the non-patterned areas), and the through-holes may be metal plated 126 to better receive the array pins. The pins can be mechanically and electrically connected to the patterned metal on the insulative layer(s) with solder or electrically conductive adhesive.

In an alternative embodiment, the logic device may be an optical device. In such case, some or all of the connectors and conductors described herein may be optically transmissive rather than electrically transmissive. A suitable optical connector and/or conductor may include an optical fiber and/or a waveguide.

The embodiments described herein are examples of compositions, structures, systems, and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems, and methods that do not differ from the literal language of the claims, and further includes other structures, systems, and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. An article comprising:
a frame assembly comprising:
    a frame base having a first surface and a second surface, and the frame base being conductive;
    a first frame insulative layer disposed on the frame base first surface;
    a frame aperture extending through the frame base;
    a frame conductive layer disposed on the first frame insulative layer; and
    a frame connector supported by the frame base in communication with at least a portion of the frame conductive layer;
an insulative web having a first surface and a second surface;
an insulative web conductive layer supported by the insulative web;
a logic device supported by the insulative web and disposed within the frame aperture;
a device connector communicating with the insulative web conductive layer, the frame connector communicating with the frame conductive layer and the insulative web conductive layer.

2. The article as defined in claim 1, wherein the logic device is an optical device, and wherein the frame connector and device connector are optically transmissive, and the frame conductive layer and the insulative web conductive layer comprise waveguides.

3. An electronic component, comprising: a frame supporting a web and a logic device secured to the web, and optical or electronic circuitry supported by the frame, and the supported optical or electronic circuitry communicates with the logic device, wherein the frame has an outer surface that defines a peripheral edge and the optical or electronic circuitry comprises an I/O port that is disposed on the peripheral edge to allow the logic device to communicate therethrough, wherein the frame has an inner surface defining an aperture, and the web is supported within the aperture, wherein the frame supplies structural rigidity to the component.

4. The component as defined in claim 3, wherein the electronic circuitry comprises one or more passive components.

5. The component as defined in claim 3, further comprising an electrical device connector through which the logic device communicates with the electronic circuitry.

6. The component as defined in claim 3, further comprising an optical device connector through which the logic device communicates with the optical circuitry.

7. The component as defined in claim 6, wherein the optical connector is an optical fiber or an optical waveguide.

8. The component as defined in claim 3, wherein the frame defines an aperture through a body of the frame through which a device connector extends.

9. The component as defined in claim 3, wherein the frame defines an open-sided channel through a body of the frame through which a device connector extends.

10. The component as defined in claim 3, wherein the frame is electrically conductive, and further comprising a dielectric layer disposed on a surface of the frame and adjacent to the electronic circuitry.

* * * * *